United States Patent [19]

Kurosawa et al.

[11] Patent Number: 5,087,901
[45] Date of Patent: Feb. 11, 1992

[54] SURFACE ACOUSTIC WAVE BAND-PASS FILTER WITH DIFFERENT PHASE WEIGHTED TRANSDUCERS

[75] Inventors: Kazuhito Kurosawa, Ibaraki; Mitsutaka Hikita, Tokyo; Toyoji Tabuchi, Kanagawa; Nobuhiko Shibagaki, Tokyo; Tetsuya Hirashima, Ibaraki, all of Japan

[73] Assignee: Hitachi, Ltd., Tokyo, Japan

[21] Appl. No.: 490,446

[22] Filed: Mar. 8, 1990

[30] Foreign Application Priority Data

Mar. 13, 1989 [JP] Japan .................................. 1-57796

[51] Int. Cl.$^5$ .............................................. H03H 9/25
[52] U.S. Cl. ..................... 333/193; 310/313 B; 310/313 C; 333/196
[58] Field of Search .................... 333/150–154, 333/193–196; 310/313 R, 313 B, 313 C, 313 D

[56] References Cited

U.S. PATENT DOCUMENTS 4,468,642  8/1984  Hikita .................... 310/313 DX

FOREIGN PATENT DOCUMENTS 252704  11/1986  Japan .................... 333/193
253712  10/1988  Japan .................... 333/193
304707  12/1988  Japan .................... 333/193

*Primary Examiner*—Paul Gensler
*Assistant Examiner*—Benny Lee
*Attorney, Agent, or Firm*—Antonelli, Terry Stout & Kraus

[57] ABSTRACT

At least one electro-acoustic transducer of a first surface acoustic wave device and acousto-electric transducers of a second surface acoustic wave device are arranged symmetrically to the first surface acoustic wave device about a line parallel to a propagating direction of surface acoustic wave and is phase-weighted differently from the remaining transducers having common phase-weighting, to improve an attenuation for stop frequency.

1 Claim, 2 Drawing Sheets

SURFACE ACOUSTIC WAVE BAND-PASS FILTER WITH DIFFERENT PHASE WEIGHTED TRANSDUCERS

BACKGROUND OF THE INVENTION

The present invention relates to a surface acoustic wave band-pass filter and, particularly, to such a filter constructed with a plurality of transducers each comprising comb type interdigital electrodes operating at a frequency in VHF or UHF frequency range.

Japanese Patent Application Laid-Open No. 202114/1982 discloses an example of a conventional surface acoustic wave band-pass filter and FIG. 2 of this application corresponds thereto.

In FIG. 2, the conventional surface acoustic wave band-pass filter comprises a substrate, a first surface acoustic wave device A arranged on the substrate, a second surface acoustic wave device B arranged on the substrate symmetrically to the first surface acoustic wave device A about a line C extending between the devices A and B in parallel to surface wave propagating direction, an electric signal source 1, an output side load 2 and an input side load 3. The first surface acoustic wave device A includes a plurality (five in this case) of first electro-acoustic transducers 14-1 to 14-5 of comb shaped interdigital electrode type arranged repetitively in the surface wave propagating direction and a plurality (four in this case) of first acousto-electric transducers 15-1 to 15-4 each arranged between adjacent ones of the first electro-acoustic transducers 14-1 to 14-5. The second surface acoustic wave device B includes a plurality (five in this case) of second acousto-electric transducers 16-1 to 16-5 of comb shaped interdigital electrode type arranged repetitively in the surface acoustic wave propagating direction and a plurality (four in this case) of second electro-acoustic transducers 17-1 to 17-4 each arranged between adjacent ones of the second acousto-electric electro transducers 16-1 to 16-5.

As shown in FIG. 2, the first acousto-electric transducers 15-1, 15-2, 15-3 and 15-4 and the second electro-acoustic transducers 17-1, 17-2, 17-3 and 17-4 are identical to each other and arranged symmetrically about the line C.

In the surface acoustic wave band-pass filter shown in FIG. 2, surface acoustic wave is trapped therein due to the repetitive arrangements of the first acousto-electric transducers 15-1 to 15-4 of the first surface acoustic device A and of the second electro-acoustic transducers 17-1 to 17-4 of the second surface acoustic wave device B, so that loss caused by surface acoustic wave leakage from opposite end portions of the filter structure is minimized. However, since this structure is intended to prevent surface acoustic wave from leaking away therefrom, there may be transmission of off-band power from an input to an output of the filter, resulting in a degraded attenuation for off-band signal.

An article, M. Hikita et al., "Phase Weighting for Low Loss SAW Filters", Proc. IEEE, Ultrasonics Symp., Nov. 1980, pp. 308-312, discloses filter designs based on a new phase weighting method, according to which the attenuation problem of off-band signal is solved to some extent. Although this proposal is effective to provide an off-band attenuation to some extent, it is still not enough.

As other related prior arts, U.S. Pat. No. 4,365,220 issued to M. Hikita who is a co-inventor of this application discloses a surface wave device using uniform phase weighting, an article, M. Hikita et al., "HIGH PERFORMANCE SAW FILTERS WITH SEVERAL NEW TECHNOLOGIES FOR CELLULAR RADIO", Proc. IEEE, Ultrasonics Symp., Nov. 14-16, 1984, pp 82-92 and U.S. Pat. No. 4,468,642 issued to M. Hikita disclose band-pass filters composed of symmetrically arranged, equally phase-weighted interdigital tansducers.

SUMMARY OF THE INVENTION

An object of the present invention is to provide a surface acoustic wave band-pass filter capable of providing a relatively large off-band signal attenuation.

In a surface acoustic wave band-pass filter composed of a substrate, a first surface acoustic wave device arranged on the substrate, a second surface acoustic wave device arranged on the substrate symmetrically to the first surface acoustic wave device, an electric signal source, an output side load and an input, side load. The first surface acoustic wave device includes a plurality of equally phase-weighted first electro-acoustic transducers of the comb shaped interdigital electrode type arranged repetitively in a surface acoustic wave propagating direction and a plurality of first acousto-electric transducers arranged repetitively and alternatively to the first electro-acoustic transducers. The second surface acoustic wave device includes a plurality of second electro-acoustic transducers of the comb shaped interdigital electrode type arranged repetitively in surface acoustic wave propagating direction and a plurality of equally phase-weighted second acousto-electric transducers arranged repetitively and alternatively to the second electro-acoustic transducers. According to the present invention, phase-weighting of at least one of the comb type transducers of at least the first acousto-electric transducers or the second electro-acoustic transducers is made different from other transducers, while keeping the effective number of electrode pairs thereof and the effective electrode length thereof unchanged, respectively.

When the phase-weightings of these tranducers each having a band-pass filter characteristics are made different from each other while their center frequencies are unchanged, the frequency characteristics thereof for stop frequency band are changed. Therefore, by suitably arranging such transducers having different stop band frequency characteristics in a single surface acoustic wave device, the band-pass filter has a composite frequency characteristic of at least two different frequency characteristics, so that an amount of attenuation of the stop band can be made larger.

DETAILED DESCRIPTION OF THE PREFERRED EMBODIMENT

An embodiment of the present invention will be described with reference to FIG. 1.

Figure 1:
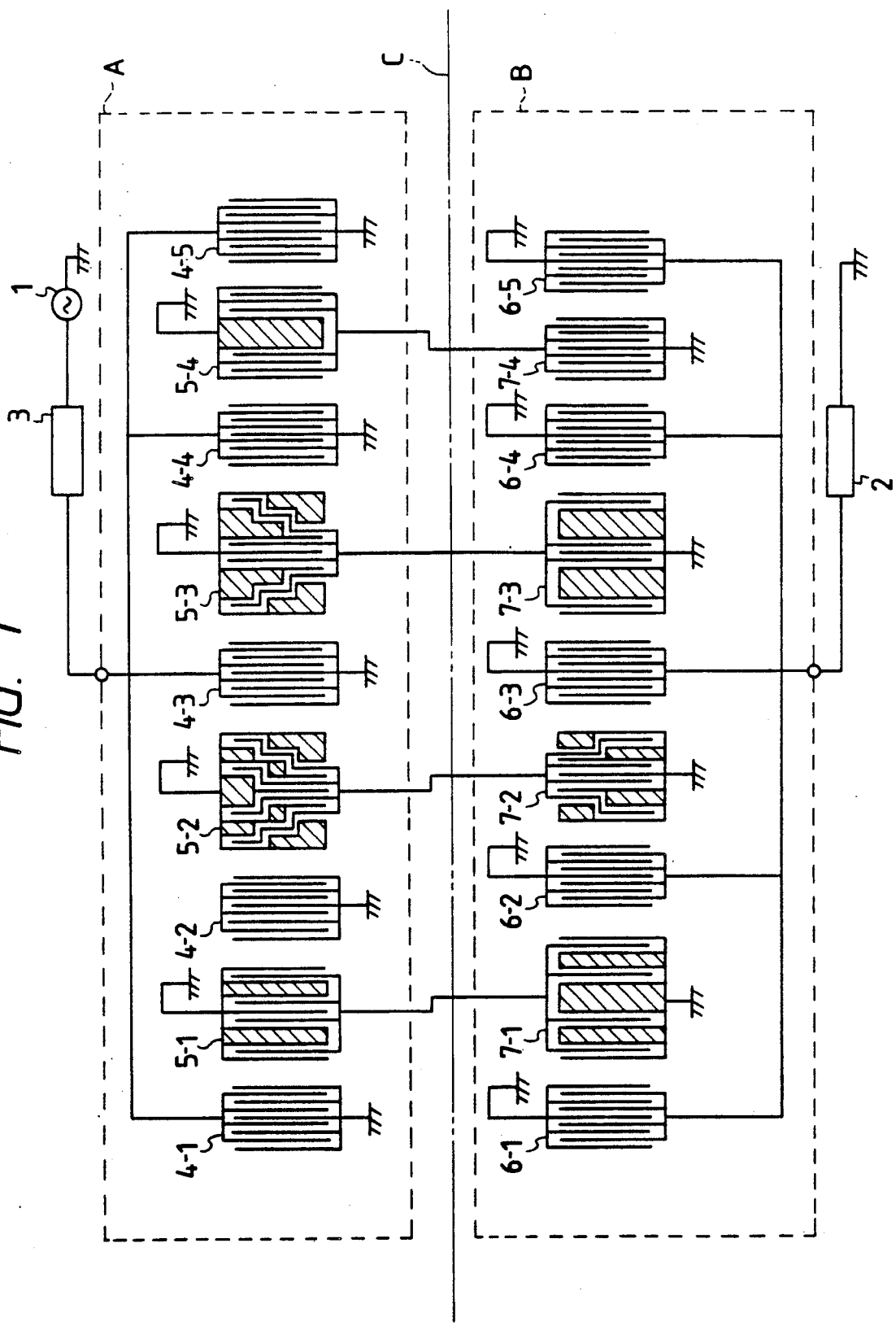
FIG. 1 shows a construction of a surface acoustic wave band-pass filter according to an embodiment of the present invention.

In FIG. 1, a surface acoustic wave band-pass filter comprises a first surface acoustic wave device A and a second surface acoustic wave device B as in the conventional device shown in FIG. 1.

The first surface acoustic wave device A comprises a plurality (in this embodiment, five) of first electro-acoustic transducers 4-1, 4-2, 4-3, 4-4 and 4-5 which are arranged repetitively along a propagating direction of surface wave and connected commonly through an input side load 3 to an electric signal source 1 and a plurality of first acousto-electric transducers 5-1, 5-2, 5-3 and 5-4 arranged repetitively and alternatively to the first electro-acoustic transducers.

The second surface acoustic wave device B comprises a plurality (in this embodiment, five) of second acousto-electric transducers 6-1, 6-2, 6-3, 6-4 and 6-5 arranged repetitively along the surface wave propagating direction and connected commonly to an output side load 2 and a plurality of second electro-acoustic transducers 7-1, 7-2, 7-3 and 7-4 arranged repetitively and alternatively to the second acousto-electric transducers. The number of effective electrode pairs and the length of the electrodes are common for all transducers.

Figure 2:
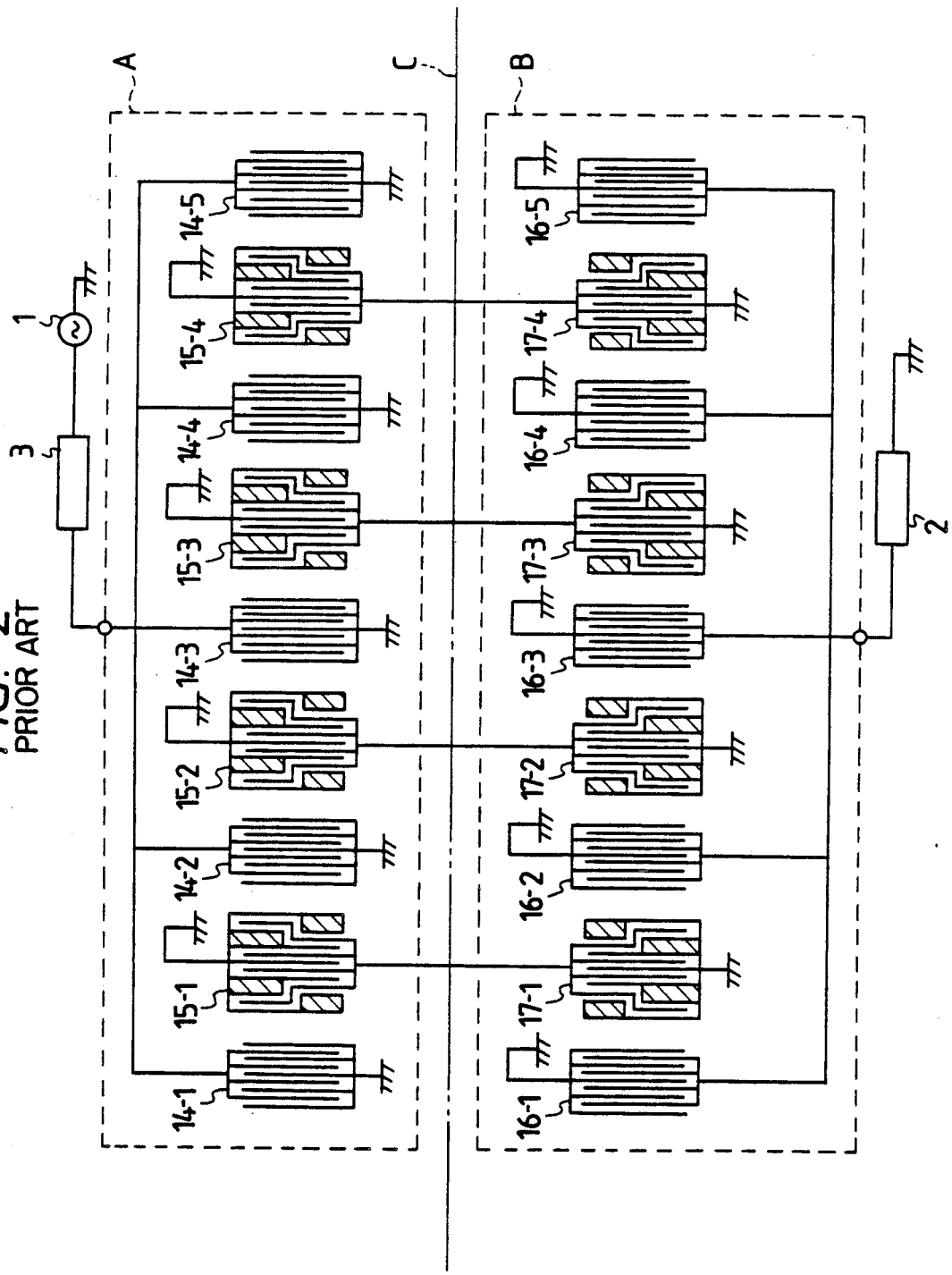
FIG. 2 shows a construction of an example of a conventional surface acoustic wave band-pass filter.

The first acousto-electric transducers 5-1, 5-2, 5-3 and 5-4 of the first surface acoustic wave device A and the second electro-acoustic transducers 7-1, 7-2, 7-3 and 7-4 of the second surface acoustic wave device B are electrically coupled to each other, respectively. As mentioned previously, in the conventional device shown in FIG. 2 the first acousto-electric transducers 15-1, 15-2, 15-3 and 15-4 and the second electro-acoustic transducers 17-1, 17-2, 17-3 and 17-4 have identically phase-weighted comb electrodes. In the present invention, however, the phase-weighting of the first acousto-electric transducers and the second electro-acoustic transducers is made different from each other, while the electrode length and the number of effective electrode pairs of them are unchanged.

With the construction mentioned above, the surface acoustic wave band-pass filter according to the present invention comprises a combination of eight filters having different frequency characteristics, so that attenuation amount for frequencies outside the pass-band frequency can be made larger than that of the conventional construction with equally phase-weighted comb electrodes.

According to the present invention in which the attenuation amount for frequencies outside the pass-band of the bandpass filter is made larger by making phase-weight of phase-weighted comb electrodes of at least one of the surface acoustic wave devices of the band-pass filter, the frequency characteristics of the surface acoustic wave bandpass filter is remarkably improved.

What is claimed is:

1. In a surface acoustic wave band-pass filter comprising a surface acoustic wave propagating substrate, a first surface acoustic wave device disposed on said substrate, a second surface acoustic wave device disposed on said substrate, said first and second surface acoustic wave devices are symmetrically arranged about a line therebetween and a propagating direction of a surface acoustic wave being parallel to said line, said first surface acoustic wave device including a first electro-acoustic transducer unit divided in the surface wave propagating direction into a plurality of repetitively arranged first electro-acoustic transducers, said plurality of first electro-acoustic transducers being connected commonly to an input electric signal source for converting said input electric signal to a first surface acoustic wave, and said first surface acoustic wave device including a first acousto-electric transducer unit having a plurality of first acousto-electric transducers arranged repetitively and alternatively to said first electro-acoustic transducers for receiving said first surface acoustic wave emitted from said first electro-acoustic transducers and converting said first surface acoustic wave into an intermediate electric signal, said second surface acoustic wave device including a second acousto-electric transducer unit divided in the surface acoustic wave propagating direction into a plurality of repetitively arranged second acousto-electric transducers, said plurality of second acousto-electric transducers being connected commonly to an output terminal, and said second surface acoustic wave device including a second electro-acoustic transducer unit having a plurality of second electro-acoustic transducers arranged repetitively and alternatively to said second acousto-electric transducers and correspondingly electrically connected to said plurality of first acousto-electric transducers of said first acousto-electric transducer unit for converting said intermediate electric signal from said first acousto-electric transducer unit into a second surface acoustic wave and emitting said second surface acoustic wave to said second acousto-electric transducer unit which provides an output electric signal at said output terminal, an improvement comprising:

at least one of a first acousto-electric transducer and a correspondingly electrically connected second electro-acoustic transducer being phase-weighted differently from each other and each said first acousto-electric transducer and said second electro-acoustic transducer being respectively phased weighted differently from other transducers of the same type on the same device.

* * * * *